March 2, 1965 J. C. FREEBORN 3,172,059

PRECISION LOW FREQUENCY OSCILLATOR

Filed Sept. 18, 1961

INVENTOR.
JOHN C. FREEBORN

BY
Osmund R. Dahle
ATTORNEY

United States Patent Office 3,172,059

Patented Mar. 2, 1965

3,172,059

PRECISION LOW FREQUENCY OSCILLATOR

John C. Freeborn, Azusa, Calif., assignor to Honeywell Inc., a corporation of Delaware Filed Sept. 18, 1961, Ser. No. 138,722

4 Claims. (Cl. 331—113)

This invention relates to a precision low frequency oscillator and more specifically to a novel transistor-magnetic core oscillator for use with a timer.

The oscillator to be described in detail below involves a unique circuit which couples a transistor bistable bridge type switching arrangement and a saturable core timing toroid for the frequency controlling element.

An object of this invention is to provide an improved precision low frequency oscillator which is a rugged, accurate and highly reliable timer.

A more specific object is to provide an improved semiconductor type bistable bridge type circuit combined with a saturable core timing toroid to provide a precision low frequency oscillator.

Figure 1:
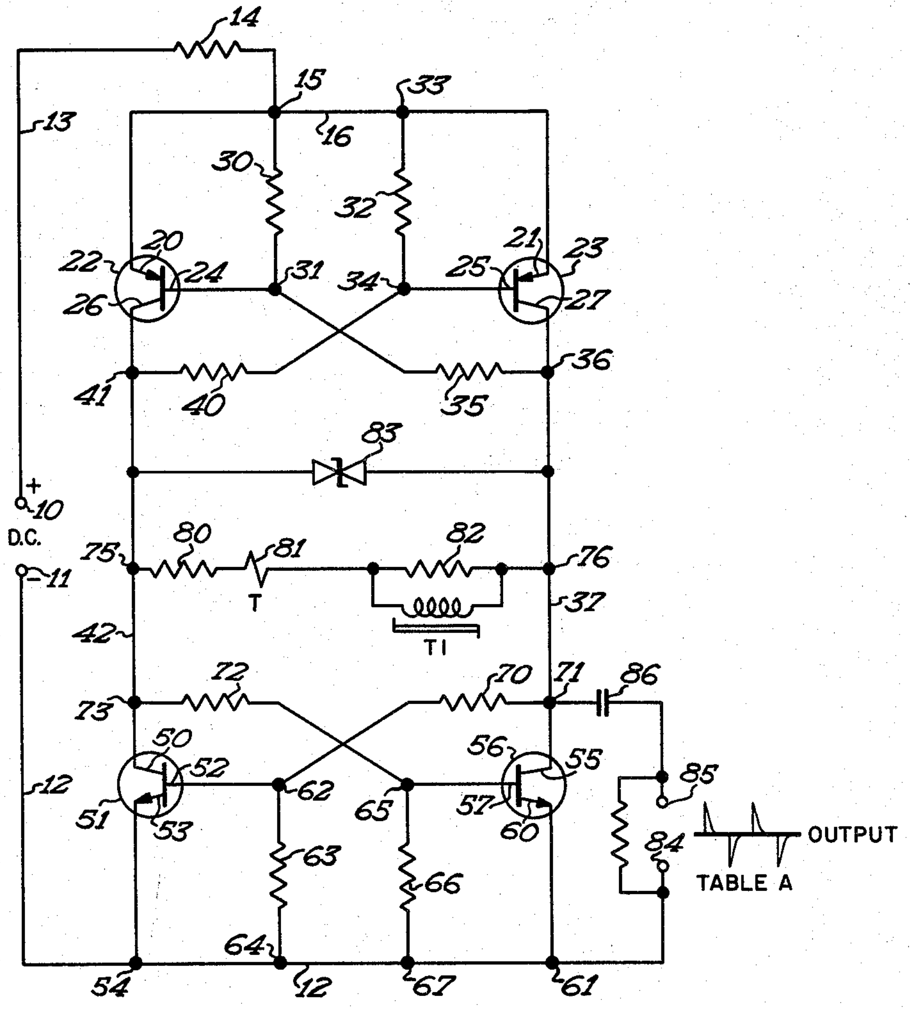
Figure 2:
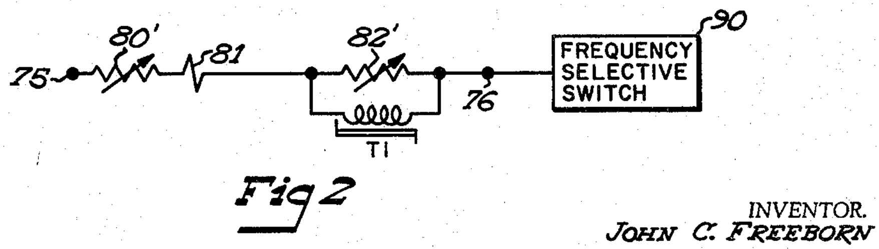

These and other objects of the invention will be more apparent upon a consideration of the specification, claims and drawing of which:

FIGURE 1 is a schematic drawing of the circuit of a preferred embodiment of this invention; and FIGURE 2 is a modification of FIGURE 1.

Referring now to the drawing, a pair of input terminals 10 and 11 are connected across a suitable source of direct current potential with the terminal 10 being positive with respect to terminal 11. Terminal 11 is connected to a common negative lead 12 while the positive terminal 10 is connected by a conductor 13 and a current limiting resistor 14 to a junction 15 on a conductor 16.

Conductor 16 is directly connected to a pair of emitter electrodes 20 and 21 of a pair of semiconductor current control devices 22 and 23, which are herein disclosed as being of the pnp type transistors. Transistors 22 and 23 also include, respectively, base electrodes 24 and 25 and collector electrodes 26 and 27. A biasing resistor 30 is connected between the junction 15 and a junction 31, which junction 31 is directly connected to base 24. Similarly, a resistor 32 is connected from a junction 33 on the conductor 16 to a junction 34, which junction 34 is directly connected to base 25. Base 24 of transistor 22 is also cross coupled to the collector electrode 27 of transistor 23 through a path which includes the junction 31, a cross coupling resistor 35, and a junction 36 on a conductor 37 which is directly connected to collector 27. The base electrode 25 of transistor 23 is similarly cross coupled to the collector electrode 26 of transistor 22 through a path which may be traced from base 25 and junction 34 through a cross coupling resistor 40 and a junction 41 on a conductor 42 which is directly connected to collector electrode 26. The transistors 22 and 23 together with the associated components above described form a first bistable searching circuit.

The second bistable circuit of this invention, which is very similar to the above described bistable circuit, will now be considered. The conductor 42 is directly connected to a collector electrode 50 of an npn junction transistor 51. Transistor 51 also includes a base electrode 52 and an emitter electrode 53, the emitter electrode being directly connected to a junction 54 on the negative conductor 12. Conductor 37 is directly connected to a collector electrode 55 of an npn transistor 56, which transistor also includes a base electrode 57 and an emitter electrode 60, which emitter electrode is directly connected to a junction 61 on the negative conductor 12. Base electrode 52 is connected by a junction 62 and a biasing resistor 63 to a junction 64 on the conductor 12. Similarly, base 57 is connected by a junction 65 and a biasing resistor 66 to a junction 67 on the conductor 12. Base 52 is cross coupled to the collector 55 by a circuit which may be traced from the base 52 through junction 62, cross coupling resistor 70 to a junction 71 on conductor 37 and thereby to collector 55. Base 57 is likewise connected to junction 65, a cross coupling resistor 72, to a junction 73 on the conductor 42 and thus to collector 50.

The above described circuit comprises primarily two bistable circuits arranged to form a bridge. Transistors will be operated on and off in pairs to permit maximum reversible power with a minimum of waste power. A pair of terminals 75 and 76, respectively, on conductors 42 and 37 can be considered as the mid points of the bridge. Connected across the mid point from junction 75 is a frequency controlling resistor 80, a temperature compensating resistor or sensistor 81, and a saturable timing toroid T1 to the junction 76. The timing toroid has a substantially rectangular hysteresis loop. Connected in parallel with the timing toroid T1 is a resistor 82. A voltage reference diode 83 is also connected across the mid points of the bridge arrangements and parallel with the elements 80, 81, 82, and T1. This voltage reference or regulating element may take the form of a single back to back zener diode or a pair of matched zener diodes connected in opposite polarity relationship to each other. The output circuit for the oscillator is taken between a terminal 84 on conductor 12 and a terminal 85 which is connected through a coupling capacitor 86 to the junction 71 on conductor 37.

In considering the operation of the circuit, the transistors 22 and 23 form a first bistable circuit together with their associated components, and the transistors 51 and 56 together with their associated components form a second bistable circuit. These two bistable circuits are arranged to form a bridge in which the transistors will be on and off in pairs; transistors 22 and 56 will be on when transistors 23 and 51 are off and vice versa. The voltage divider across the bridge comprising resistors 80 and 82 together with temperature compensating resistor 81 and toroid winding T1 make up the load for the bistable bridge. When the core of saturable toroid T1 is not saturated, it acts as a high impedance and the biasing and cross coupling resistors for each of the transistors are chosen to be of a value which permits the transistors for the bridge to be biased to a point which is fully on for load current required prior to saturation of the core of timing toroid T1.

Let us now consider a first half cycle or a first state of operation of the oscillator in which transistors 22 and 56 are conductive. A current path may be traced from the positive terminal 10 through conductor 13, current limiting resistor 14, junction 15, through transistor 22 from emitter 20 to collector 26, conductor 42, junction 75, through the load comprising resistor 80, sensistor 81, timing toroid winding T1 and paralleled resistor 82, junction 76, from collector 55 to emitter 60 of npn transistor 56, to junction 61 and through the conductor 12 to negative terminal 11.

The time base depends upon the volt-second integration of the magnetic core of timing toroid T1. This requires that a closely controlled or regulated voltage appear across terminals 42 and 37 since the time of integration is inversely proportional to the voltage being applied to its windings, all other factors being constant. For this reason, the non-polarized zener voltage regulator 83 is connected across the terminals 42 and 37 to maintain this voltage constant. Voltage variations regulated by the zener 83 are dropped across the resistor 14.

The first half cycle continues until saturation of the core of timing toroid T1, the impedance of winding T1 then decreases and the increase in current causes a voltage drop across the "on" transistors 22 and 56 and causes the bistables to flip to their opposite mode or state of conduction thereby commencing the second half of operation. The voltage is then reversed across the timing toroid T1 so that it again becomes a high impedance.

A current path for the second half cycle of operation may be traced from positive terminal 10 through conductor 13 and resistor 14, conductor 16, through transistor 23 from emitter 21 to collector 27, conductor 37 to junction 76, through timing toroid T1, sensistor 81, resistor 80 to junction 75, through conductor 42 and from collector 50 to emitter 53 of npn transistor 51, then through junction 54 of conductor 12 to negative conductor 11. The non-polarized zener voltage regulator 83 maintains the voltage across junction 76 and 75 the same as it was during the first half cycle operation so that the volt-second integration of the core will provide the same time on the second half cycle as in the first. As described above, the zener regulator 83 need not be a non-polarized type but may comprise two matched zeners connected in polarity opposition. As flux saturation is reached in the reversed direction of the core of timing toroid T1, the current tends to increase through transistors 23 and 51 causing a drop across these "on" transistors and causing the bistables to flip again to their original mode of operation thereby completing a cycle and commencing a new cycle of operation.

Several parameters of the integrating magnetic core circuit of T1 are often variable with temperature and therefore temperature compensation is provided by the use of the sensistor 81.

The output pulses from the oscillator are shown in Table A adjacent output terminals 84 and 85 of FIGURE 1.

In one successful embodiment of the invention for an oscillator operating at approximately 100 cycles per second the following components were utilized:

| | |
|---|---|
| Resistor 14 | 6K ohms. |
| Resistors 30, 32, 63, 66 | 560 ohms. |
| Resistors 35, 40, 72, 70 | 6.8K ohms. |
| Resistor 80 | 50 ohms. |
| Resistor 82 | 1.96K ohms. |
| Temperature coefficient resistor 81 | Sensistor. |
| Transistors 22, 23 | CK66A. |
| Transistors 51, 56 | 2N821. |
| Capacitor 86 | 0.047 mf. |

The above circuit maintained a frequency stability of 0.1% over a temperature range from −40° to +110° F.

It will be recognized that frequency changes can be made in the oscillator by changing resistors 80 and/or 82 or by changing the toroid T1. A modification of the circuit of FIGURE 1 is shown in FIGURE 2 in which the resistors 80 and 82 are shown as being condition responsive variable resistors. For example, they could be made to be pressure sensitive in order to alter the output frequency of the oscillator as a function of the pressure, this varying frequency then being fed into a frequency selective switch 90 to provide a switch closure dependent upon applied pressure. One form of pressure sensitivity would be a resistor deposited on each side of a diaphragm, the diaphragm being flexed due to pressure. Pressure sensitive systems of this type could be used in Barro-switches and hydrostats, for example.

Many changes and modifications of this invention will undoubtedly occur to those who are skilled in the art, and I therefore wish it to be understood that I intend to be limited by this scope of the appended claims and not by the specific embodiment of my invention which is disclosed herein for the purpose of illustration only.

I claim:

1. Low frequency oscillator apparatus comprising: a source of electrical energy; first bistable transistor circuit means comprising first and second transistors each having a plurality of electrodes including first and second output electrodes and a control electrode; saturable inductance means having first and second terminals; voltage regulator means; means connecting one terminal of said source to said first output electrodes of said first and second transistors; second bistable transistor circuit means comprising third and fourth transistors each having a plurality of electrodes including first and second output electrodes and a control electrode; means including the output electrodes of said third and fourth transistors connecting the second output electrodes of said first and second transistors respectively, to the other terminal of said source; impedance means cross coupling said second output electrodes of each of said first and second transistors to the control electrode of the other; further impedance means cross coupling said first output electrodes of each of said third and fourth transistors to the control electrode of the other; connection means connecting the first and second terminals of said saturable inductance means intermediate the second output electrodes of said first and second transistors, respectively, to cause said first and second bistable circuits to switch to their opposite conductivity states upon saturation of said saturable inductance means; and means connecting said voltage regulating means to said connection means to regulate the voltage across said saturable inductance means thereby stabilizing the time required for saturation to provide a precision oscillator.

2. Low frequency oscillator apparatus comprising: a source of electrical energy; first and second bistable semiconductor circuit means comprising first, second, third and fourth semiconductor current control means each having first and second output electrodes and a control electrode; means connecting one terminal of said source to a first output electrode of said first and second semiconductor means; means connecting a first output electrode of said third and fourth semiconductor means respectively, to the other terminal of said source; first conductive means interconnecting the second output electrodes of said first and third semiconductor means; second conductive means interconnecting the second output electrodes of said second and fourth semiconductor means; impedance means cross coupling said second output electrodes of said first and second semiconductor means to the control electrode of the other; further impedance means cross coupling said second output electrodes of said third and fourth semiconductor means to the control electrode of the other; saturable inductance means having first and second terminals; voltage regulator means; connection means connecting the first and second terminals of said saturable inductance means intermediate said first and second conductive means, respectively; and means connecting said voltage regulating means to said connection means in parallel with said saturable inductance means to regulate the voltage thereacross.

3. Low frequency oscillator apparatus comprising: a source of electrical energy; first bistable transistor circuit means comprising first and second transistors each having a plurality of electrodes including first and second output electrodes and a control electrode; saturable inductance means having first and second terminals; means connecting one terminal of said source to said first output electrodes of said first and second transistors; second bistable transistor circuit means comprising third and fourth transistors each having a plurality of electrodes including first and second output electrodes and a control electrode; means including the output electrodes of said third and fourth transistors connecting the second output electrodes of said first and second transistors, respectively, to the other terminal of said source; impedance means cross coupling said second output electrodes of each of said first and second transistors to the control electrode of the other; further impedance means cross coupling said first output electrodes of each of said third and fourth transistors to the control electrode of the other; and connection means connecting the first and second terminals of said saturable inductance means intermediate the second output electrodes of said first and second transistors, respectively, to cause said first and second bistable circuits to switch to their opposite conductivity states upon saturation of said saturable inductance means.

4. Low frequency oscillator apparatus comprising: a source of electrical energy; first and second bistable semiconductor circuit means comprising first, second, third and fourth semiconductor current control means each having first and second output electrodes and a control electrode; means connecting one terminal of said source to a first output electrode of said first and second semiconductor means; means connecting a first output electrode of said third and fourth semiconductor means respectively, to the other terminal of said source; first conductive means interconnecting the second output electrodes of said first and third semiconductor means; second conductive means interconnecting the second output electrodes of said second and fourth semiconductor means; impedance means cross coupling said second output electrodes of said first and second semimconductor means to the control electrode of the other; further impedance means cross coupling said second output electrodes of said third and fourth semiconductor means to the control electrode of the other; saturable inductance means having first and second terminals; and connection means connecting the first and second terminals of said saturable inductance means intermediate said first and second conductive means, respectively.

References Cited by the Examiner

UNITED STATES PATENTS

| | | | |
|---|---|---|---|
| 2,963,658 | 12/60 | Rochelle | 331—113 |
| 3,030,590 | 4/62 | Fougere et al. | 331—113 |
| 3,038,127 | 6/62 | Wofford | 331—113 |
| 3,059,191 | 10/62 | Hierholzer et al. | 331—113 |
| 3,074,030 | 1/63 | Hierholzer | 331—113 |
| 3,080,534 | 3/63 | Paynter | 331—113 |

OTHER REFERENCES

High-Power Transistor D.C. Converters by Pye, pages 96–105, March 1959, in Electronic and Radio Engineer.

JOHN KOMINSKI, *Primary Examiner.*

ROY LAKE, *Examiner.*